United States Patent [19]

Kaya

[11] Patent Number: 5,146,307
[45] Date of Patent: Sep. 8, 1992

[54] FUSE HAVING A DIELECTRIC LAYER BETWEEN SLOPED INSULATOR SIDEWALLS

[75] Inventor: Cetin Kaya, Dallas, Tex.

[73] Assignee: Texas Instruments Incorporated, Dallas, Tex.

[21] Appl. No.: 700,746

[22] Filed: May 15, 1991

Related U.S. Application Data

[60] Division of Ser. No. 587,508, Sep. 21, 1990, Pat. No. 5,019,532, which is a continuation of Ser. No. 457,443, Dec. 27, 1989, abandoned.

[51] Int. Cl.5 ................ H01L 27/02; H01L 29/34
[52] U.S. Cl. .................... 357/51; 357/54; 357/90
[58] Field of Search ................ 357/51, 54, 90

[56] References Cited

U.S. PATENT DOCUMENTS

| | | | |
|---|---|---|---|
| 4,502,208 | 3/1985 | McPherson | 357/51 |
| 4,543,594 | 9/1985 | Mohsen et al. | 357/51 |
| 4,598,462 | 7/1986 | Chandrasekhar | 29/577 |
| 4,635,345 | 1/1987 | Hankins et al. | 29/577 |
| 4,823,181 | 4/1989 | Moshen et al. | 357/51 |
| 4,847,732 | 7/1989 | Stopper et al. | 357/51 |
| 4,876,220 | 10/1989 | Moshen et al. | 437/170 |
| 5,008,721 | 4/1991 | Gill et al. | 357/23.5 |

*Primary Examiner*—J. Carroll
*Attorney, Agent, or Firm*—W. James Brady, III; Lawrence J. Bassuk; Richard L. Donaldson

[57] ABSTRACT

A method for forming a fuse for integrated circuits and a fuse produced therefrom is disclosed. The fuse (10) includes a substrate (12) having thick oxide layers (14) with a gap (16) formed therebetween. A second oxide layer (20) is grown onto an N+ region (18). At the intersection between oxide layers (20, 14), a sublithographic area is exposed and a dielectric layer (24) is formed therein. This structure is capable of reducing the capacitance between a polysilicon layer (26) formed thereon and the N+ diffusion region (18).

6 Claims, 2 Drawing Sheets

FUSE HAVING A DIELECTRIC LAYER BETWEEN SLOPED INSULATOR SIDEWALLS

This application is a division of U.S. patent application Ser. No. 07/587,508, filed Sep. 21, 1990, U.S. Pat. No. 5,019,532, which is a continuation of U.S. patent application Ser. No. 07/457,443, filed Dec. 27, 1989, now abandoned.

TECHNICAL FIELD OF THE INVENTION

The present invention relates to a method for manufacturing integrated circuits and an apparatus made therefrom. More particularly, the invention relates to an improved method for forming a fuse for an integrated circuit.

BACKGROUND OF THE INVENTION

As the integrated circuit industry becomes more and more competitive, there is a need for more efficient integrated circuits which deliver electronic messages at faster rates than is presently accomplished. To design faster parts, the capacitance associated with interconnects, passive and active devices need to be reduced. For PROMs which use a thin dielectric as the fusing element, the capacitance of the cell will be greatly affected by the capacitance of the thin dielectric. Generally, capacitance per unit area of a thin film capacitor is equal to the ratio of the area divided by the thickness of the dielectric.

In the past, this limitation of capacitance has been dealt with by reducing the area of the fuse region and increasing the thickness of the dielectric. Unfortunately thicker dielectrics require higher voltages for fusing (dielectric breakdown). This in turn makes the incorporation of high voltage devices to standard logic process flow more difficult. Higher voltage requirements will as well increase the device isolation space making the cell bigger.

For a given lithographic capability, the area of the fuse cell would be limited by the minimum size of the geometry than can be defined by lithography.

Therefore, there is a need for a thin dielectric system for lower programming voltage while at the same time having very small area to reduce the capacitance associated with the fuse dielectric.

SUMMARY OF THE INVENTION

The present invention provides a method for forming a fuse on a semiconductor wafer and a fuse made therefrom. It allows the fabrication of a fuse cell where the area of the thin dielectric region is much smaller than that can be defined by lithography.

One aspect of the present invention is an apparatus having a layer of field oxide with a gap area formed therebetween to define a moat area. Within the moat area, an N+ region is fabricated by implanting an arsenic dopant therein. After the dopant has created the N+ region, a second oxide layer is formed in the moat region within the gap area. In its preferred embodiment, the second oxide layer is thinner the field oxide layer formed. A region is formed at the intersection between the first and second oxide layers to expose the N+ region. At this exposed N+ region, a dielectric is formed in accordance with the present invention. In its preferred embodiment, this dielectric is a composite of oxide and nitride. Specifically, a thin layer of oxide is initially grown onto the exposed N+ region. Subsequently, a layer of nitride is deposited onto the oxide layer. Finally, the top surface of the nitride is converted to oxide in an oxidizing ambient to make the dielectric of the present invention. After this dielectric has been formed, a layer of polysilicon is deposited over the entire dielectric stack.

A method for fabricating the fuse described above is preferably manufactured by initially growing a field oxide layer to a thickness of approximately 8000 angstroms on a silicon layer to form a moat region therein. This moat region is subsequently implanted with an arsenic having a concentration of approximately $2 \times 10^{16}$ atoms/cm$^2$ to create an N+ diffused region. The implantation of the arsenic dopant is followed by the growth of a second layer of oxide on the diffused region. A small portion of the N+ region is then exposed by selectively etching through the field and second oxide layers. The dielectric, as described above, is deposited onto the N+ region. Finally, a polysilicon layer is deposited onto the N+ region to complete the preferred embodiment of the present invention.

The present invention presents technical advantages over the prior method of fabricating a semiconductor fuse. This invention is capable of having a thin dielectric layer while at the same time having a low capacitance. The present invention has the capability of having a low capacitance by decreasing the area of the dielectric while at the same time maintaining a thin dielectric.

BRIEF DESCRIPTION OF THE DRAWINGS

Other aspects of the invention and their advantages may be appreciated with reference to the following Detailed Description taken in conjunction with the appended Drawings in which:

FIG. 1b is a top view of the workpiece as illustrated in FIG. 1a;

DETAILED DESCRIPTION OF THE INVENTION

Figure 1A:
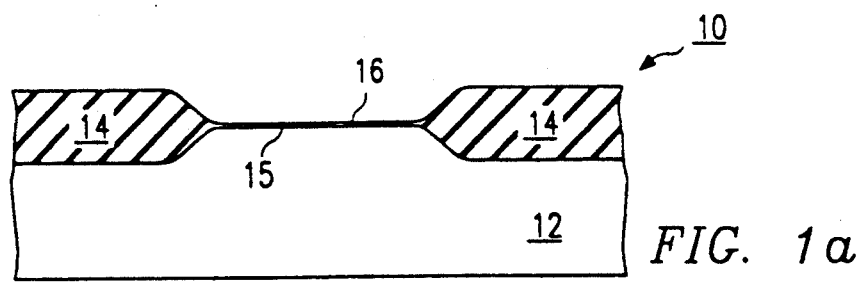
FIG. 1a is an enlarged cross-sectional view of a workpiece with a layer of field oxide grown thereon, according to the present invention.

FIG. 1a is an enlarged cross-sectional view of a workpiece according to the present invention, generally designated 10. Workpiece 10 comprises a substrate 12, preferably a silicon wafer, having a boron dopant contained therein to create a P— region. Substrate 12 is generally a semiconductor layer in its broadest sense. A mask is selectively formed on a face of the semiconductor layer to define the area of field oxide layer 14 growth. Grown on substrate 12 is a field oxide layer 14 which functions as an insulator layer. Field oxide layer 14 is selectively grown to define a moat area 16 or diffused region. When forming field oxide layer 14 on substrate 12, it is preferable to heat the wafer to approximately 900 degrees Centigrade (°C.) for approximately 50 minutes with steam at approximately ten atmospheres. This heating of substrate 12 causes field oxide layer 14 to grow to approximately 8,000 angstroms thick. The actual thickness of field oxide layer 14 is dependent upon time, pressure, and temperature of the steam oxidation process. After substrate 12 has been adequately doped, a thin oxide layer 15 is thermally grown to approximately 350 angstroms thick in the moat region 16.

Figure 1B:
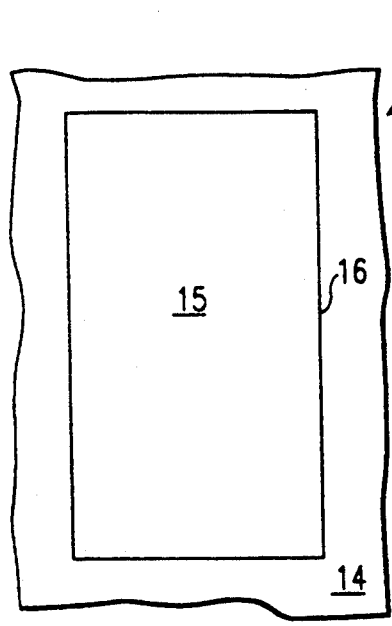

Referring now to FIG. 1b, a top view of workpiece 10, as illustrated in FIG. 1a, can be seen. Generally, moat area 16 is defined in a rectangular configuration. Moat area 16 can be formed in any one of several alternative configurations.

Figure 2:
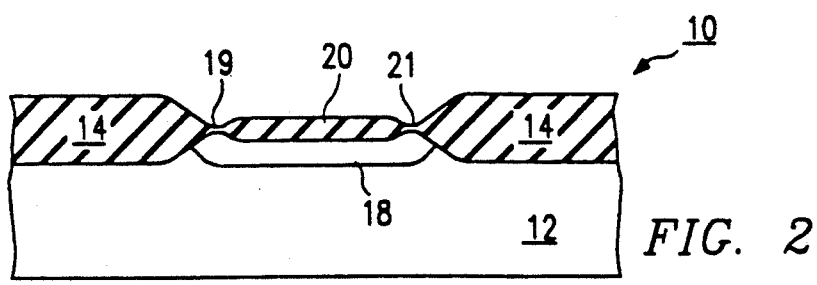
FIG. 2 is an enlarged cross-sectional view of the workpiece as shown in FIG. 1a, illustrating a second oxide layer grown within a moat region as defined by the field oxide layer.

Referring now to FIG. 2, an enlarged cross-sectional view of a workpiece 10 illustrates subsequent processing steps. Initially, an N+ region 18 is formed in moat area 16 by controllably implanting an N-type dopant. This dopant is preferably arsenic, and is diffused into substrate 12 at an energy of 50 KeV and a dosage of about $1 \times 10^{16}$ atoms/cm$^2$.

After N+ region 18 has been formed, a second oxide layer 20 is formed in moat region 16. As can be seen, "buried" N+ oxide layer 20 is formed having ends 19 and 21. Layer 20 is formed by heating substrate 12 to approximately 900° C. and in the presence of oxygen for ten minutes. Substrate 12 is next heated to 900° C. for 38 minutes with steam. This process is followed by heating substrate 12 for approximately one minute at −900° C. in the presence of oxygen. This series of heating steps selectively grows oxide layer 20. The above-discussed implantation was self-aligned to the sloping edges of the field oxide 14. The concentration of dopant in region 18 decreases as a function of the thickness of the oxide layer 14 over it. The oxide layer 20 grows at a faster rate than dimples or ends 19 and 21 because the dopant concentration underneath layer 20 is greater. The combination of the sloped sidewalls or "bird's beak" of oxide layer 14 and the differential growth of oxide layer 20 creates a relative depression in the thickness of the oxide.

Figure 3B:
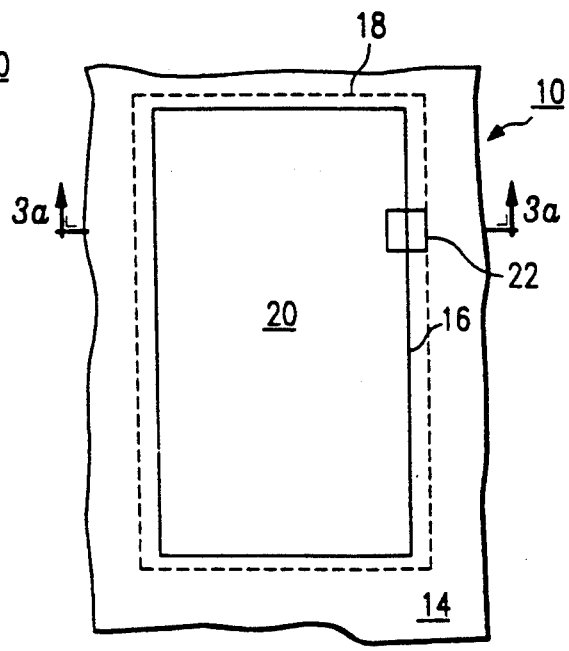
FIG. 3b is a top view of the workpiece as illustrated in FIG. 3a taken substantially along line 3a—3a of FIG. 3b.
Figure 3A:
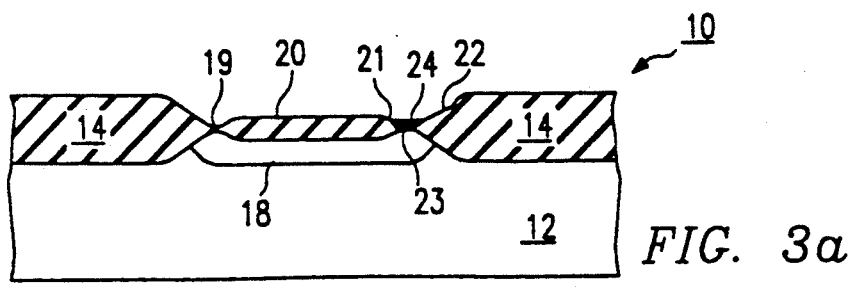
FIG. 3a is an enlarged cross-sectional view of the workpiece after a dielectric has been formed thereon.

Now referring to FIG. 3a, photoresist layers are deposited and patterned onto workpiece 10 to define a region for subsequent etching of fuse area 22. The etch is preferably performed using a 10% buffered hydrofluoric acid (HF). Once fuse area 22 has been etched, a gap region forms 23 at end 21 where the N+ region is exposed. This exposed region is subsequently used for the depositing of layers to form a dielectric thereon. The sloping sidewalls of layers 14 and 20 mean that the size of the exposed region 23 can be carefully controlled by timing the etchback. Hence, an extremely small, submicron exposed area may be fabricated without the scaling limitations imposed by microlithography. The reduction in area translates into a reduction of cell capacitance.

A dielectric 24 is formed at end 21 by depositing or growing oxides and nitrides thereon. An oxide layer is grown approximately 35 to 40 angstroms thick by submitting workpiece 10 to 700° C. for ten minutes in the presence of nitrogen. Subsequently, workpiece 10 is exposed for 18 minutes to oxygen, followed by the exposure of substrate 12 to nitrogen for ten minutes. After the oxide has been deposited to form the first composite layer of dielectric 24, a nitride is deposited to approximately 85 angstroms thick. Another oxide layer is then deposited. This deposition is performed by submitting workpiece 10 to a temperature of approximately 900° C. for 110 minutes in the presence of argon and oxygen. This method of creating a deposit dielectric can be easily understood by referring to U.S. Pat. No. 4,823,181, issued to Mohsen, et. al., entitled "Programmable Low Impedance Anti-Fusion Element", and incorporated herein for reference.

Referring now to FIG. 3b, a top view of workpiece 10 as illustrated in FIG. 3a can be seen. Fuse area 22 is formed onto moat area 16. As can be appreciated, fuse area 22 can be anywhere along the boundary of moat area 16, depending upon the particular application.

Figure 4A:
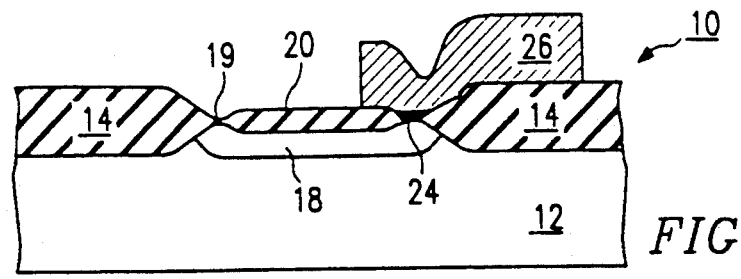
FIG. 4a is an enlarged cross-sectional view of the workpiece after a polysilicon layer has been deposited to interconnect the N+ region with a contacting element.

Referring now to FIG. 4a, an enlarged cross-sectional view of workpiece 10 can be seen. In accordance with the present invention, a polysilicon layer 26 is deposited to make contact with dielectric layer 24.

To complete the fabrication of the present invention, it is preferable that polysilicon layer 26 be deposited to approximately 4,500 angstroms thick. The workpiece 10 is submitted to a phosphorus dopant ambient in POCl$_3$ at 900° C. for 30 minutes to increase the conductivity of polysilicon layer 26. Once the layer has been formed, an arsenic dopant is implanted into polysilicon layer 26 at approximately 70 KeV and a dosage of $2 \times 10^{16}$ atoms/cm$^2$. After polysilicon layer 26 has been initially deposited, the configuration can be defined by depositing a photoresist layer patterning it and etching away the areas not covered by photoresist.

Figure 4B:
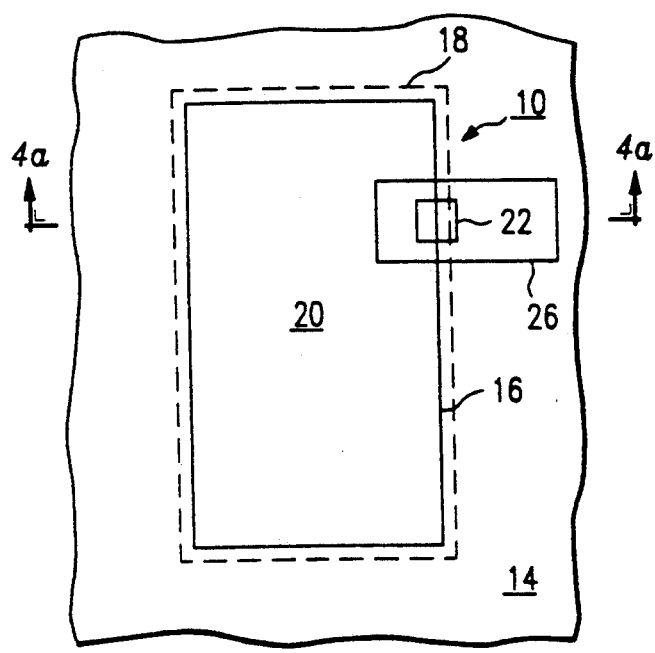
FIG. 4b is a top view of the workpiece as illustrated in FIG. 4a taken substantially along line 4a—4a of FIG. 4b.

FIG. 4b is a top view of workpiece 10, as illustrated in FIG. 4a.

Figure 5:
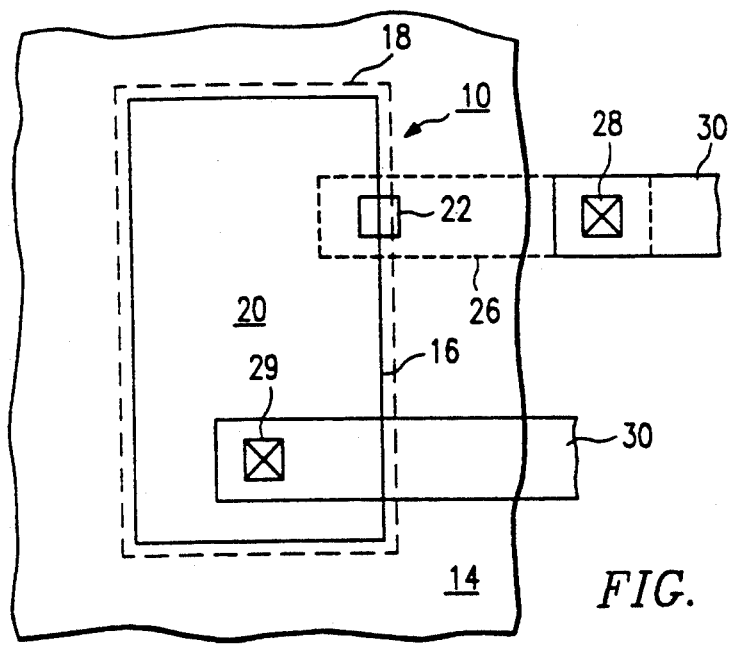
FIG. 5 is a top view of the workpiece 10 having contacts connected thereto, according to the present invention.

Referring now to FIG. 5, contacts are formed to polysilicon layer 26 and the surface of workpiece 10. A contact 29 is made through the oxide layer 20 to diffused region 18 to make electrical connection to the other electrode of the capacitor. Metal strips 30 may next be applied to contacts 28 and 29 to complete the illustrated embodiment of the present invention.

The present invention presents technical advantages over the prior art because it reduces capacitance of the formed capacitor. Unfortunately, prior art has not overcome the problems associated with a high capacitance due to a high ratio of the area divided by its thickness. According to the present invention, this specific embodiment is able to overcome problems associated with the prior art because of the small size of the semiconductor electrode.

While the preferred embodiment of the present invention and its advantages have been disclosed in the above-detailed description, the present invention is not limited thereto, but only by the spirit and scope of the appended claims.

What is claimed is:

1. A fuse formed on a face of a semiconductor layer of a first conductivity type, comprising:
   a first insulator layer extending over said face, said first insulator layer having a first sloped sidewall;
   a region of a second conductivity type opposite said first conductivity type formed in said face adjacent said first sloped sidewall, said region having a dopant concentration which decreases as the thickness of said first insulator layer over said region increases;

a second insulator layer extending over a portion of said region, said second insulator layer having a second sloped sidewall, said first and second sloped sidewalls spaced apart by a gap on said region, said second insulator layer having a thickness which increases as the dopant concentration of said region under said second insulator layer increases;

a dielectric layer formed between said first and second sloped sidewalls and over said gap; and a conductor adjacent said dielectric layer.

2. The fuse of claim 1 in which said dielectric layer includes:

a first oxide layer formed on said gap;

a nitride layer formed on said first oxide layer; and a second oxide layer formed on said nitride layer.

3. The fuse as recited in claim 1, wherein said first insulator layer has a thickness of approximately 8,000 angstroms.

4. The fuse of claim 1 in which said first and second insulator layers are oxide layers.

5. The fuse as recited in claim 1, wherein said dielectric layer has a thickness of approximately 125 angstroms.

6. The fuse of claim 1 in which said first and second insulator layers intersect adjacent said gap.

* * * * *